(12) United States Patent
Edelhaeuser

(10) Patent No.: US 9,059,705 B1
(45) Date of Patent: Jun. 16, 2015

(54) RESISTIVE RANDOM ACCESSED MEMORY DEVICE FOR FPGA CONFIGURATION

(75) Inventor: Frank Edelhaeuser, Dresden (DE)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 13/174,077

(22) Filed: Jun. 30, 2011

(51) Int. Cl.
*H03K 19/177* (2006.01)
*H01L 25/00* (2006.01)

(52) U.S. Cl.
CPC .......... *H03K 19/177* (2013.01); *H03K 19/1776* (2013.01)

(58) Field of Classification Search
USPC .............................................. 326/37–47, 101
See application file for complete search history.

(56) References Cited

U.S. PATENT DOCUMENTS

| | | |
|---|---|---|
| 5,499,208 A | 3/1996 | Shoji |
| 5,673,223 A | 9/1997 | Park |
| 5,923,587 A | 7/1999 | Choi |
| 6,181,587 B1 | 1/2001 | Kuramoto et al. |
| 6,731,535 B1 | 5/2004 | Ooishi et al. |
| 6,867,618 B2 | 3/2005 | Li et al. |
| 6,897,519 B1 | 5/2005 | Dosluoglu |
| 7,167,387 B2 | 1/2007 | Sugita et al. |
| 7,251,152 B2 | 7/2007 | Roehr |
| 7,274,587 B2 | 9/2007 | Yasuda |
| 7,345,907 B2 | 3/2008 | Scheuerlein |
| 7,402,847 B2 | 7/2008 | Kozicki et al. |
| 7,511,532 B2 | 3/2009 | Derharcobian et al. |
| 7,515,454 B2 | 4/2009 | Symanczyk |
| 7,561,461 B2 | 7/2009 | Nagai et al. |
| 7,606,059 B2 | 10/2009 | Toda |
| 7,692,959 B2 | 4/2010 | Krusin-Elbaum et al. |
| 7,746,696 B1 | 6/2010 | Paak |
| 7,760,538 B1 | 7/2010 | Paak |
| 7,764,536 B2 | 7/2010 | Luo et al. |
| 7,869,253 B2 | 1/2011 | Liaw et al. |
| 8,054,679 B2 | 11/2011 | Nakai et al. |
| 8,102,018 B2 | 1/2012 | Bertin et al. |
| 8,243,542 B2 | 8/2012 | Bae et al. |

(Continued)

FOREIGN PATENT DOCUMENTS

| | | |
|---|---|---|
| EP | 1096465 A2 | 2/2001 |
| KR | 10-2009-0051206 A | 5/2009 |

OTHER PUBLICATIONS

Office Action and List of References for U.S. Appl. No. 12/815,318 dated May 16, 2012 from the United States Patent and Trademark Office.

(Continued)

*Primary Examiner* — Anh Tran
(74) *Attorney, Agent, or Firm* — Amin, Turocy & Watson, LLP

(57) ABSTRACT

A non-volatile field programmable gate array includes a logic component, a transistor device comprising a gate structure, a first impurity region, and a second impurity region, the first impurity region coupled to the reconfigurable logic component, and a resistive switching device comprising a bottom electrode coupled to the first impurity region, a top electrode spatially extending in a first direction, and a resistive switching element coupled to the top electrode and to the bottom electrode at an intersecting region between the bottom electrode and the top electrode, wherein the resistive switching device stores a resistance state from a plurality of resistance states that indicates a configuration code for the reconfigurable logic component.

29 Claims, 6 Drawing Sheets

(56) References Cited

U.S. PATENT DOCUMENTS

| | | | |
|---|---|---|---|
| 8,269,203 B2 | 9/2012 | Greene et al. | |
| 8,315,079 B2 | 11/2012 | Kuo et al. | |
| 8,456,892 B2 | 6/2013 | Yasuda | |
| 8,467,226 B2 | 6/2013 | Bedeschi et al. | |
| 8,675,384 B2 | 3/2014 | Kuo et al. | |
| 2003/0036238 A1* | 2/2003 | Toet et al. | 438/328 |
| 2007/0133250 A1 | 6/2007 | Kim | |
| 2008/0043521 A1 | 2/2008 | Liaw et al. | |
| 2009/0091981 A1 | 4/2009 | Park et al. | |
| 2009/0251941 A1 | 10/2009 | Saito | |
| 2010/0039136 A1* | 2/2010 | Chua-Eoan et al. | 326/38 |
| 2010/0067279 A1 | 3/2010 | Choi | |
| 2010/0102290 A1 | 4/2010 | Lu et al. | |
| 2010/0110767 A1 | 5/2010 | Katoh et al. | |
| 2010/0171086 A1 | 7/2010 | Lung et al. | |
| 2010/0182821 A1 | 7/2010 | Muraoka et al. | |
| 2011/0001115 A1 | 1/2011 | Greene et al. | |
| 2011/0063888 A1 | 3/2011 | Chi et al. | |
| 2011/0066878 A1 | 3/2011 | Hosono et al. | |
| 2011/0122679 A1 | 5/2011 | Chen et al. | |
| 2011/0205780 A1 | 8/2011 | Yasuda et al. | |
| 2012/0074507 A1 | 3/2012 | Jo et al. | |
| 2012/0075910 A1 | 3/2012 | Yasuda | |
| 2012/0120712 A1 | 5/2012 | Kawai et al. | |
| 2012/0320660 A1 | 12/2012 | Nazarian et al. | |

OTHER PUBLICATIONS

International Search Report for PCT/US2011/046036 filed on Jul. 29, 2011.
Written Opinion of the International Searching Authority for PCT/US2011/046036 filed on Jul. 29, 2011.
Office Action for U.S. Appl. No. 12/900,232 dated Jul. 30, 2012.
Notice of Allowability for U.S. Appl. No. 13/051,296 dated Aug. 31, 2012.
Notice of Allowability for U.S. Appl. No. 12/900,232 dated Sep. 18, 2012.
Notice of Allowance for U.S. Appl. No. 12/815,318 dated Nov. 29, 2012.
International Search Report and Written Opinion for PCT/US2012/044077 filed on Jun. 25, 2012.
Office Action for U.S. Appl. No. 13/651,169 dated Mar. 7, 2013.
Office Action for U.S. Appl. No. 13/764,710 dated Aug. 9, 2013.
Notice of Allowance for U.S. Appl. No. 13/481,696 dated Sep. 30, 2013.
International Search Report and Written Opinion for PCT/US2013/042746 filed on May 24, 2013.
Notice of Allowability for U.S. Appl. No. 13/651,169 dated Oct. 28, 2013.
Notice of Allowance for U.S. Appl. No. 13/194,500 dated Oct. 28, 2013.
Office Action for U.S. Appl. No. 13/194,479 dated Sep. 25, 2013.
Liu, Ming et al., "rFGA: CMOS-Nano Hybrid FPGA Using RRAM Components", IEEE International Symposium on Nanoscale Architectures, Jun. 12-13, 2008, pp. 93-98, Anaheim, USA.
International Search Report and Written Opinion for PCT/US2012/048712 filed on Jul. 27, 2012.
Office Action for U.S. Appl. No. 13/194,479 dated Dec. 17, 2012.
Office Action for U.S. Appl. No. 13/531,449, dated Jun. 30, 2014.
Office Action for U.S. Appl. No. 14/166,691, dated Jul. 9, 2014.

* cited by examiner

| | FPGA Configuration | FPGA Operation |
|---|---|---|
| Bitline | $V_{WRITE}/V_{ERASE}$ | $V_{READ}$ |
| Wordline | Selects RRAM cell(s) to be programmed | "Off" |
| Bias | $V_{WRITE}/V_{ERASE}$ | "Off" |
| FPGA ConfigBit | -- | $I_{ON}$ -- if programmed<br>$I_{OFF}$ -- if erased |

RESISTIVE RANDOM ACCESSED MEMORY DEVICE FOR FPGA CONFIGURATION

BACKGROUND

The present invention is related to field programmable gate array. More particularly, embodiments according to the present invention provide a field programmable gate array having an embedded resistive switching device. The embedded resistive switching device provides a non-volatile memory cell for configuration and reconfiguration of the field programmable gate array. Embodiments of the present invention have been applied to configurations and operations of a field programmable gate array. But it should be recognized that embodiments according to the present invention can have a much broader range of applicability.

The success of semiconductor devices has been mainly driven by an intensive transistor down-scaling process. However, as field effect transistors (FET) approach sizes less than 100 nm, problems such as short channel effect can degrade device performance. Moreover, such sub 100 nm device size can lead to sub-threshold slope non-scaling and also increases power dissipation. It is generally believed that transistor-based memories such as those commonly known as Flash may approach an end to scaling within a decade.

Other non-volatile random access memory devices such as ferroelectric RAM (FeRAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, FeRAM and MRAM devices have fast switching characteristics and good programming endurance, but their fabrication is not CMOS compatible and size is usually large. Switching for a PCRAM device requires a high power. Organic RAM is incompatible with large volume silicon-based fabrication and device reliability is usually poor. Desirable attributes of a high density device should include high switching speed, reliable switching, and high endurance, among others.

From the above, a new semiconductor device structure and integration is desirable

BRIEF SUMMARY OF THE PRESENT INVENTION

Embodiments according to the present invention are related to field programmable gate array. More particularly, the present invention provides a field programmable gate array having an embedded resistive switching device. The embedded resistive switching device provides a non-volatile memory cell for configuration and reconfiguration of the field programmable gate array. Embodiments of the present invention have been applied to configurations and operations of a field programmable gate array. But it should be recognized that embodiments according to the present invention can have a much broader range of applicability.

In a specific embodiment, a non-volatile field programmable gate array is provided. The non-volatile field programmable gate array includes a reconfigurable logic component, a transistor device, and a resistive switching device operably coupled to the transistor device. The transistor device includes at least a gate structure, a first impurity region, and a second impurity region. The first impurity region is operably coupled to the reconfigurable logic component in a specific embodiment. In a specific embodiment, the resistive switching device includes a bottom electrode in electric contact with the first impurity region. The resistive switching device further includes a top electrode configured to spatially extend in a first direction, and a resistive switching element configured in an intersecting region between the bottom electrode and the top electrode. In a specific embodiment, the resistive switching device is configured to store a configuration code for the reconfigurable logic component as one or more resistance states.

In a specific embodiment, a method of configuring a field programmable gate array is provided. The method includes providing a field programmable gate array. The field programmable gate array includes a plurality of resistive switching device, a plurality of transistor device, and a plurality of reconfigurable logic components. Each of the plurality of transistor device is operably coupled to a respective resistive switching device and vertically integrated with the respective resistive switching device using one or more via structure in a specific embodiment. The method includes selecting a resistive switching device to be programmed and applying a first voltage to a gate of the selected transistor associated with the switching device to cause the channel region of the selected transistor to be conductive. A second voltage is then applied between the top electrode of the resistive switching device and the second impurity region of the selected transistor to apply a first bias voltage to the resistive switching device to cause the resistive switching device to be in a predetermined resistance state and to store a configuration code for a selected reconfigurable logic component. The method removes the first voltage and the second voltage and applies a third voltage to the top terminal of the RRAM device to measure a respective current flows in each of the resistive switching device to determine a respective resistance state of each of the resistive switching device. The respective resistance state of each of the resistive switching device is outputted to a configuration data file. The configuration data file contains a plurality of configuration codes for commands to reconfigure each of the plurality of reconfigurable interconnects and to reconfigure each of the reconfigurable logic for the reconfigurable logic components to perform predetermined functions in a specific embodiment.

Many benefits can be achieved by ways of the present invention over conventional techniques. For example, embodiments according to the present invention provide a device structure for a field programmable gate array. The field programmable gate array includes a non-volatile memory device for a configuration bit of the gate array. Each of the non-volatile memory devices is configured to be controlled by a transistor (or a 1T1R arrangement) in a specific embodiment. The transistor is further coupled to a logic component of the field programmable gate array to be configured by the configuration bit. The transistor has a high utilization as there is only one transistor device to control and configure both the memory device and the gate array. Additionally, the device is characterized by a small device size (no more than about $4F^2$, where F is an RRAM feature size, and $20F^2$ per transistor) thus reducing per bit fabrication cost. The present device can be fabricated using CMOS compatible process techniques without modification to the processing equipment. Depending on the embodiment, one or more of these benefits may be achieved. One skilled in the art would recognize other variations, modifications, and alternatives.

SUMMARY OF THE DRAWINGS

FIG. 3 is a table summarizing configuration and operation of the FPGA according to embodiments of the present invention.

DETAILED DESCRIPTION OF THE PRESENT INVENTION

Embodiments according to the present invention are directed to resistive switching devices. More particularly, embodiments according to the present invention provide a device configuration and a method for an embedded resistive switching device in a logic block of a field programmable gate array. But it should be recognized that the present invention can have a much broader range of applicability. For example, embodiments according to the present invention can be applied to display devices, including light emitting diodes, liquid crystal displays, programmable mirrors, plasma displays, and others.

Memory devices can be loosely classified as volatile and non-volatile. In general, a volatile memory loses the data or information stored after power off and reloading is required after power on. These devices are characterized by a fast programming speed, usually in nanoseconds and low logic utilization. Examples of volatile memory include DRAM, SRAM, and others. Non-volatile memory devices retain information after power off and can configure immediately after power on. Example of non-volatile memory commonly used include EPROM, EEPROM, Flash, among others. These non-volatile memory devices use charge storage on a gate or a dielectric and have a slow programming speed with high logic utilization.

Figure 1:
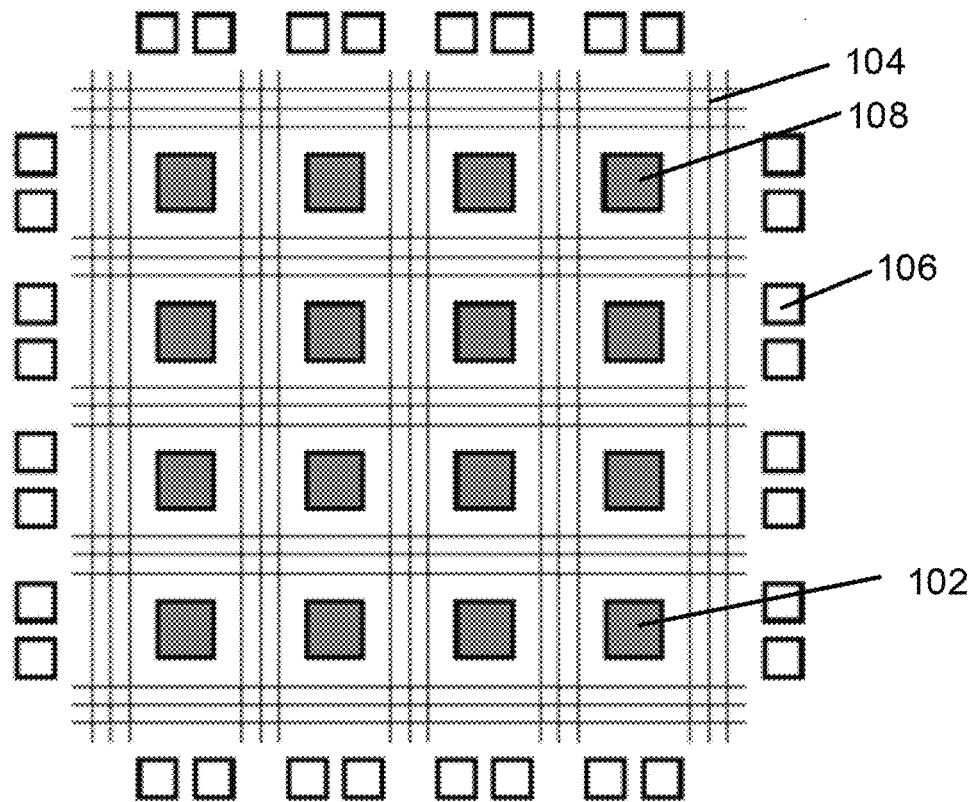
FIG. 1 is a simplified diagram illustrating a conventional field programmable gate array.

Demand for large capacity and complex devices lead to the emergence of field programmable gate array, or FPGA. A field programmable gate array allows end users to program the device or update the functionality or partially re-configure of a portion of a design to perform specific functions. It offers the advantages of low cost, flexibility, quick fabrication and more importantly, easy design changes. As illustrated in FIG. 1, a FPGA comprises an array of logic blocks 102 and a plurality of interconnects 104. An end user can configure the FPGA for specific application by programming or reconfiguring the interconnects to perform application specific function on input/output pads 106. The input/output pads are then connected to other devices. Within each logic block, there are prefabricated transistors arrays and reconfigurable interconnect (reconfigurable logic) 108 to produce custom applications. The instructions or codes for programming are stored, permanently or temporarily in a memory device as a part of the logic block. Conventional memory device used in FPGA application includes volatile memory such as SRAM. Though a SRAM can have a fast programming speed, it utilizes six to eight CMOS transistors and has a large die size of about 160 F2 or more. Data are not stored after power off and need to be reloaded. Non-volatile memories such as charge storage device, for example FLASH, PROM, EPROM, EEPROM, and the likes are also used. These non-volatile memory devices can be used an as part of the logic block or as an external storage component for the SRAM. Logic utilization for a Flash memory is high and the programming speed is usually slow. Fabrication for Flash memory also requires non-CMOS compatible fabrication processes that further increases manufacturing cost. Another conventional code storage device uses an antifuse positioned between two interconnect wires. The antifuse comprises of an insulator between two conductors. Upon programming, the insulator becomes a connecting link between the interconnect wires. Once programmed, the connecting link becomes permanent and therefore an antifuse merely provides a one-time-programmable memory device.

Accordingly, embodiments according to the present invention provide an embedded non-volatile memory device in a FPGA. The embedded non-volatile memory device is re-programmable thus provides flexibility in configuring the field programmable gate array. Additionally, the embedded non-volatile memory device can be vertically integrated with controlling transistor devices, such as a CMOS device to reduce overall memory (device and driver) size. The non-volatile memory device is also characterized by a high switching speed, other enhanced device performance, and others.

The terms "top" and "bottom" are for reference only and should not be construed to be limiting.

Figure 2:
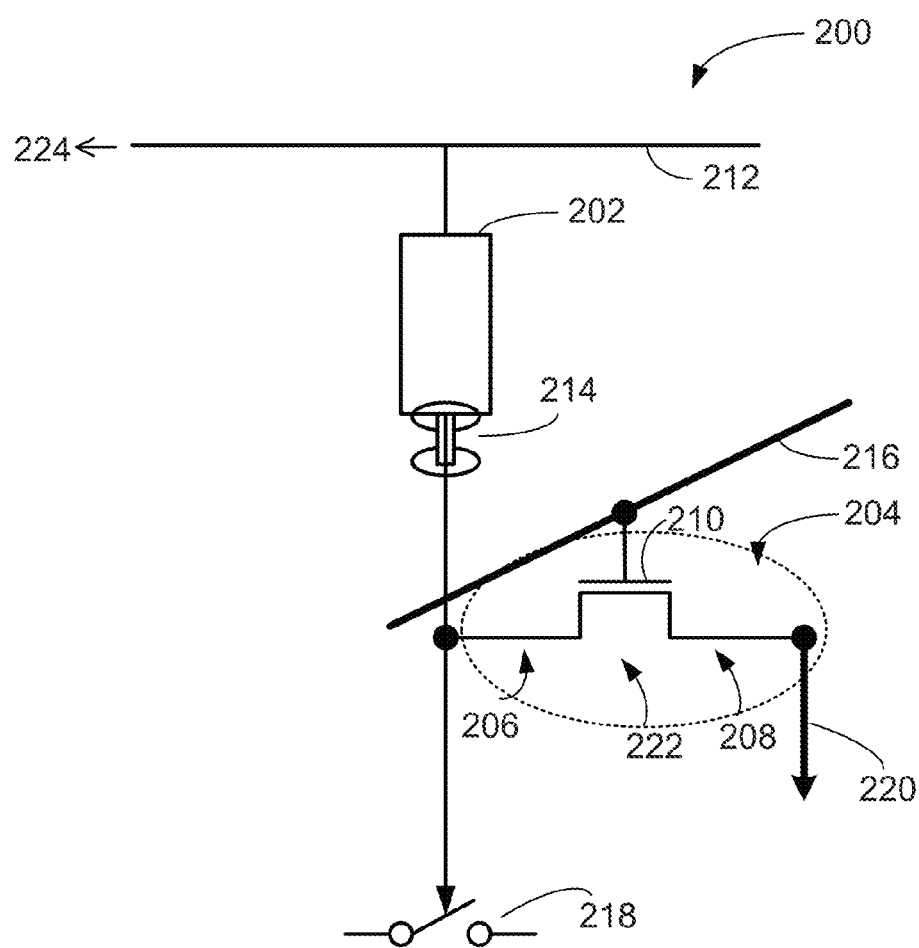
FIG. 2 is a simplified diagram illustrating a configuration bit structure for a field programmable gate array according to an embodiment of the present invention.

FIG. 2 is a simplified diagram illustrating a configuration bit structure 200 for a field programmable gate device according to an embodiment of the present invention. As shown, the configuration bit structure includes a resistive random accessed memory (RRAM) device 202 operably coupled to a transistor device 204 in an one transistor one RRAM (1T1R) configuration. The transistor device 204 includes a first impurity region 206, a second impurity region 208, a gate 210, and a channel region 222 between the first impurity region and the second impurity region. The transistor device can be a CMOS, MOSFET, and others, depending on the application. As shown, the RRAM device includes a top electrode 212, which can be a bitline for the RRAM device in a specific embodiment. The RRAM device includes a bottom electrode, which can be coincident with the first impurity region 206 of the transistor device in a specific embodiment. As shown, the bottom electrode (or the first impurity region) is electrically connected to the RRAM using a via structure 214 and may be vertically integrated with the transistor device in a specific embodiment.

The RRAM device includes a resistive switching element configured in an intersection region of the top electrode 212 and the bottom electrode. The resistive switching element is characterized by a resistance depending on an operating voltage applied to the bottom electrode or the top electrode, in a specific embodiment. As shown, the top electrode 212 is elongated in shape and spatially configured to extend in a first direction in a specific embodiment. Gate 210 of the transistor device is electrically connected to a wordline 216. As shown, the wordline is spatially configured to extend in a second direction orthogonal to the first direction, in a specific embodiment. In a specific embodiment, the configuration bit structure is configured in an N by M array, where N and M are integers each having a value greater than 1. As the controlling transistor and the RRAM are vertically integrated, the N by M array has an advantage of a high density and a small feature size.

Referring again to FIG. 2. In a specific embodiment, the resistive switching element 202 can be formed from a suitable dielectric material characterized by a resistance modulated by an electric field in the dielectric material. In a specific embodiment, the resistive switching element can be an amorphous silicon material deposited using techniques such as a chemical vapor deposition (CVD) process, including low pressure CVD, plasma enhanced CVD, and others. The amorphous silicon material may be deposited using a physical vapor deposition (PVD) process using a suitable silicon target material. The amorphous silicon material is not intentionally doped in a specific embodiment.

Depending upon the embodiment, the top electrode 212 includes a first portion comprising an active metal material in physical and electrical contact with the resistive switching element, for example, the amorphous silicon material in a specific embodiment. The active metal material can be silver, copper, gold, palladium, platinum, nickel, aluminum, or others. In a specific embodiment, the active metal material can be silver and amorphous silicon material as the resistive switching material. The active metal material forms a metal region within a portion of the resistive switching material upon the application of the electric field. The metal region can include at least a filament structure having a length depending on an amplitude and a polarity of an applied electric field in a specific embodiment. The top electrode 212 further includes a second portion configured to extend in the first direction in a specific embodiment. The second portion can be formed from tungsten, copper, aluminum, or others. The second portion of the top electrode can further include an adhesion material and/or a diffusion barrier material depending on the embodiment.

Referring yet again to FIG. 2. Gate 210 of the transistor device can be a select gate for the RRAM device in a specific embodiment. As shown, top electrode or the bit line 212 is operably coupled to a first bit terminal 224. In the case of an array, the RRAM's in a row have a common bit line and a common terminal (as further illustrated in FIG. 4). Once an RRAM is selected, for example, for programming or writing, a select voltage or a gate voltage is applied to gate 210. The gate voltage causes channel region 222 to be conductive and an operating bias voltage is applied to a second bit terminal 220 coupled to second impurity region 208 to cause a bias voltage between bit line 212 and first impurity region 206.

In various embodiments, for programming, bitline 212 is at a positive bias with respect to first impurity region 206 for the RRAM using amorphous silicon material as the resistive switching material. The programmed state is a low resistance state, or high bit state, and having a first bit value of "1" and an on state current flows in the RRAM. To erase the RRAM after programming, an erase voltage having a second amplitude substantially the same as the programming voltage and having a polarity opposite to the programming voltage is applied to the bit line to cause the RRAM to be in a high resistance state, or a low bit state or a second bit value of "0". Depending on the embodiment, the erase voltage can have an amplitude slightly lower, slightly higher, or approximately the same as the programming voltage.

The state of the resistive switching device provides a bit value for a FPGA configuration bit 218. Embodiments according to the present invention use a one transistor coupled to one resistive switching device (1T1R) for FPGA configuration. For example, the configuration bit 218 can be coupled to a FPGA fabric to control or to configure a hardware. In FPGA operation, the select voltage (at gate 210) and the operating voltage are removed and a read voltage is applied to the bitline 212 and a read current is measured to determine the bit value. The read voltage can have an amplitude of less than about half of that of the write voltage or the erase voltage in a specific embodiment. If an on-state current flows in the selected resistive switching device or the selected cell, the selected cell is in a programmed state or a high bit state. Else, if an off-state current (typically lower) flows in the selected resistive switching device 202, the selected cell in a low bit state. Accordingly, each of the resistance states of the resistive switching device 202 provides a bit value and a configuration bit for the field programmable gate array in a specific embodiment. In the case of an array, the read voltage is applied simultaneously to the bitlines of all the RRAM's in the array and an output of all the bit values of the RRAM is obtained as a configuration data file. A table summarizing configuration and operation of a FPGA is shown in FIG. 3

Figure 4:
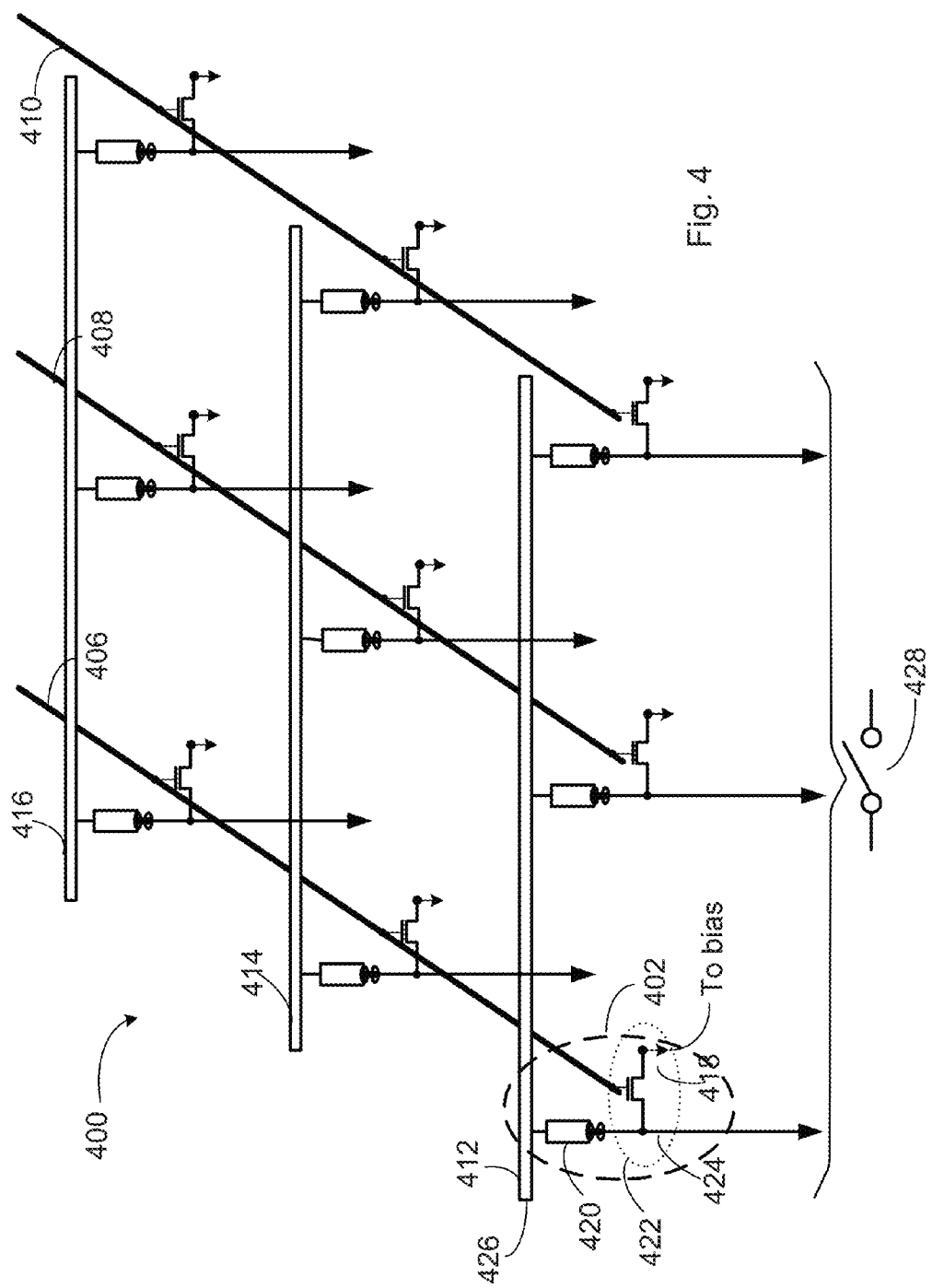
FIG. 4 is a simplified diagram illustrating a 3 by 3 FPGA array according to embodiments of the present invention.

FIG. 4 illustrates a 3×3 array 400 of configuration bits for a FPGA according to an embodiment of the present invention. This diagram is merely an example, and should not limit the scope of the claims herein. One skilled in the art would recognize other variations, modifications, and alternatives. The 3×3 array includes nine configuration bits for the FPGA. Each of the configuration bit includes an RRAM device operably coupled to a respective transistor device as shown in FIG. 2. The 3×3 array comprises a first wordline 406, a second wordline 408, and a third wordline 410. The 3×3 array also includes a first bitline 412, a second bitline 414, and a third bitline 416, as shown. Each of the wordlines (for example, wordline 410) is coupled to each of the gates of the respective transistor in a column. Each of the bitlines (e.g. 412) is coupled to a respective bit terminal and a first impurity region (for example, source region) through a respective RRAM.

Taking configuration bit 402 as an example. RRAM 420 and transistor 422 are associated with configuration bit 402. An as fabricated array would have each RRAM at an off state or a high resistance state. To select RRAM 420 for programming, a select voltage is applied to wordline 406. The select voltage causes a channel region of at least transistor 422 associated with configuration bit 402 to be conductive. A predetermined bias voltage is applied to, for example, second impurity region 418 to cause a bias voltage between bit line 412 and impurity region 424. To program RRAM 420 or to cause RRAM 420 to be in a high bit state, the bias voltage is a positive voltage with respect to first impurity region 424 in a specific embodiment. To erase the RRAM after programming, configuration bit 402 is selected by applying the select voltage to the gate, and a negative bias with respect to impurity region 424 is applied between bitline 412 and impurity region 424. If RRAM 420 is at a high bit state, a negative bias voltage applied to bitline 412 would cause the RRAM to change from the high bit state to a low bit state. The low bit state is a high resistance state in a specific embodiment.

Accordingly, embodiments according to the present invention provide an array of configuration bits for a FPGA and a method for programming each of the configuration bit. Each of the configuration bits is reconfigurable by changing the bit value of the associated RRAM. For example, the associated RRAM is in a high bit if it is programmed and a low bit if it is not programmed or has been erased after programmed. The bit values of each of the RRAM in the array provide a configuration data file for the FPGA.

To determine each of the bit values of the RRAM in the configuration data file in the array, the FPGA is subjected to a read operation wherein each of the gates is floated or no voltage is applied to the gate. Instead, a read voltage Vread is applied between each of the bitlines and first impurity region simultaneously in the array, the current flow in each of the RRAM is measured. The read voltage has an amplitude no greater than the write voltage or the erase voltage and no greater than half of the write voltage or the erase voltage so that inadvertent writing or erasing a cell is avoided.

Again, as merely an example, for an RRAM using amorphous silicon as the resistive switching material and silver material as the active conductive material, the write voltage or the programming voltage ranges from about 3 volts to about 6 volts, positive bias as applied to the active conductive material. The erase voltage can have substantially a same amplitude and an opposite polarity to the programming voltage in a specific embodiment.

The configuration data file comprises configuration for FPGA function. As merely examples, the FPGA can be used to control display devices such as liquid crystal display (LCD), thin film transistors, or light emitting diodes (LED), and others. These display devices can be used in projectors or mirrors, electronic paper or Braille terminal, among others. Each of the configuration bits is configured to control a display element in the display device.

Figure 5:
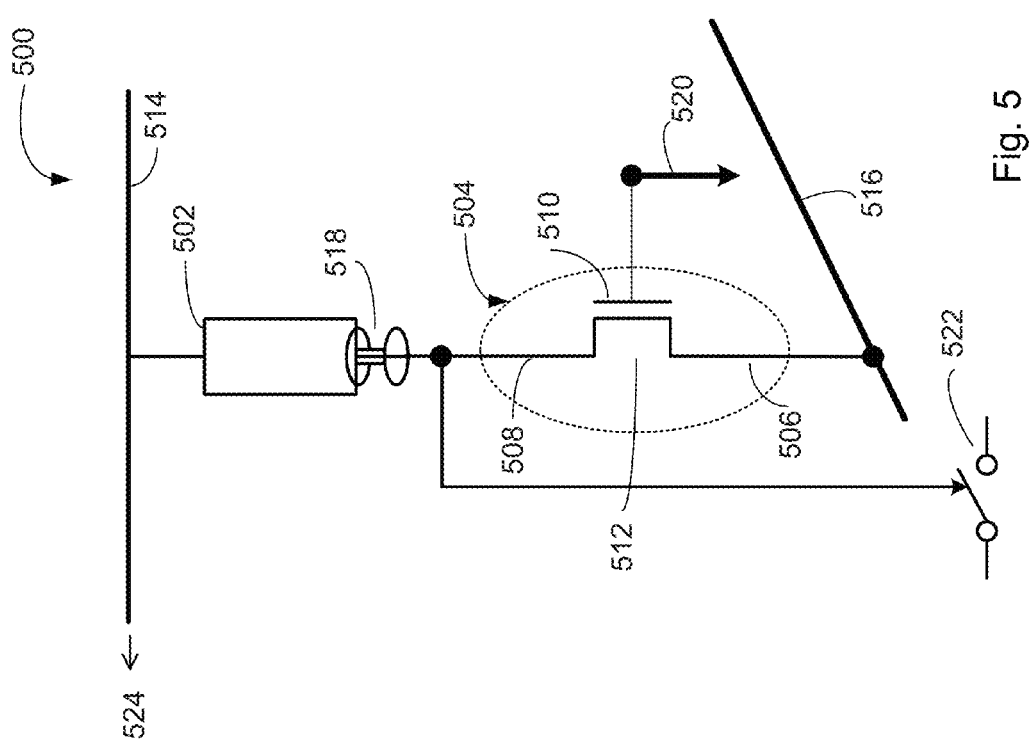
FIG. 5 is a simplified diagram illustrating an alternative configuration bit structure for a field programmable gate array according to an embodiment of the present invention.

Depending on the embodiment, there can be other variations as illustrated in FIG. 5. As shown in FIG. 5, an alternative FPGA configuration bit structure 500 is illustrated. FPGA configuration bit structure 500 includes an RRAM 502 operably and physically coupled to a transistor device 504 using a via structure 518. As shown, transistor device 504 comprises a first impurity region 506, a second impurity region 508, and a gate 510. A channel region 512 is configured between the first impurity region and the second impurity region in a vicinity of the gate structure, as shown. The configuration bit structure includes a bitline 514, which is a top electrode of the RRAM device. A wordline 516 is connected to, for example, first impurity region 506 of the transistor device to provide a bias voltage for RRAM 502 to be programmed or to be erased after programming. A program enable signal 520 is applied to transistor gate 510 if RRAM 502 is selected for programming or erasure after programming. The program enable signal 520 determines and controls whether the selected FPGA configuration bit structure is to be configured or in a program operation or an erase operation. Program enable signal 520 also determines if the FPGA configuration bit structure is in a FPGA operation. To select the RRAM to be programmed or to be erased, a select voltage is applied to the gate. The select voltage causes a channel region 512 of transistor 504 to be conductive. A programming voltage or an erase voltage is now applied between bit line 514 and word line 516 of the selected RRAM device. For amorphous silicon as the resistive switching material, a positive bias voltage applied to bit line 514 with respect to word line 516 causes the RRAM to be in a written state or a programmed state. A negative bias voltage applied to bit line 514 with respect to word line 516 would cause RRAM 502 to be erased after programming.

In FPGA operation, program enable signal 520 is configured such that the channel region of transistor 504 is not conductive, by removing the select voltage. The programming voltage or the erase voltage is also removed. A read voltage, Vread, is applied between bitline 514 and second impurity region 508 and a current flow is measured in RRAM 502 associated with programmable FPGA logic function connected to data bit 522. If the current measured in data bit 522 is greater than a threshold value, the FPGA configuration bit is at a high bit state. If the current measured in data bit 522 is below a threshold value, the FPGA configuration bit is at a low bit state. The read voltage can have an amplitude no greater than the write voltage or the erase voltage and no greater than half of the write voltage or the erase voltage so that inadvertent writing or erasing a cell is avoided. Of course one skilled in the art would recognize other modifications, variations, and alternatives.

Figure 6:
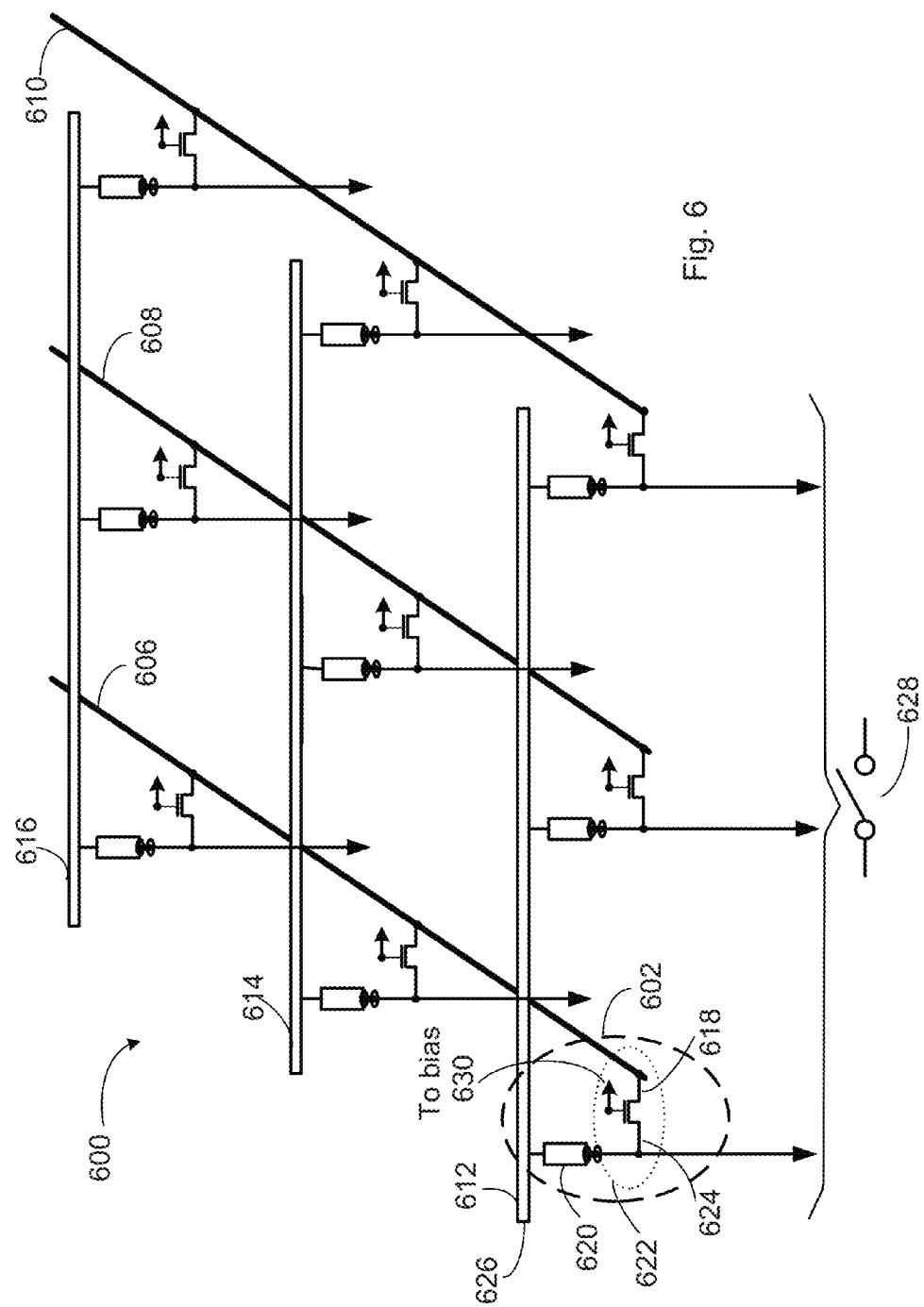
FIG. 6 is a simplified diagram illustrating an alternative configuration bit structure for a 3 by 3 FPGA array according to embodiments of the present invention

Configuration bit structure 500 can be configured in an N by M array as illustrated in FIG. 6. A 3 by 3 array 600 is illustrated. Array 600 includes 9 configuration bits for the FPGA. The 3×3 array includes nine configuration bits for the FPGA. Each of the configuration bit includes an RRAM device operably coupled to a respective transistor device as shown in FIG. 5. The 3×3 array comprises a first wordline 606, a second wordline 608, and a third wordline 610. The 3×3 array also includes a first bitline 612, a second bitline 614, and a third bitline 616, as shown. Each of the wordlines (for example, wordline 610) is coupled to a respective first impurity region (for example, source region) of each of the transistor device. Each of the bitline is a top electrode for RRAM's in a common row and coupled to a respective bit terminal in a specific embodiment.

Taking configuration bit 602 as an example. RRAM 620 and transistor 622 are associated with configuration bit 602. An as fabricated array would have each RRAM at an off state or a high resistance state. A program enable signal 630 is applied to transistor gate 510 if RRAM 502 is selected for programming or erasure after programming. Program enable signal 530 determines and controls whether the selected FPGA configuration bit structure is to be configured or in a program operation or an erase operation. Program enable signal 630 also determines if the FPGA configuration bit structure is in a FPGA operation. To select the RRAM to be programmed or to be erased, a select voltage is applied to the gate. The select voltage causes a channel region 632 of transistor 622 to be conductive. A programming voltage or an erase voltage is now applied between bit line 624 and word line 618 of selected RRAM device 602. For amorphous silicon as the resistive switching material, a positive bias voltage applied to bit line 612 with respect to word line 606 causes RRAM 602 to be in a written state or a programmed state. To erase configuration bit 602 after programming as determined by program enable signal 630, a negative bias voltage applied to bit line 612 with respect to word line 618 would cause RRAM 602 in a high bit state to be erased after programming. The erase voltage changes RRAM 602 from the high bit state to a low bit state. The low bit state is a high resistance To determine each of the bit values of the RRAM in the configuration data file in array 600, the FPGA is subjected to a read operation wherein each of the gates is floated or no voltage is applied to the gate. Instead, a read voltage Vread is applied between each of the bitlines and second impurity region (for example 624) simultaneously in the array, the current flow in each of the RRAM is measured. The read voltage has an amplitude no greater than the write voltage or the erase voltage and no greater than half of the write voltage or the erase voltage so that inadvertent writing or erasing a cell is avoided Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A non-volatile field programmable gate array, comprising:
   a reconfigurable logic component;
   a transistor device coupled to the reconfigurable logic component, comprising a gate structure, a first impurity region, and a second impurity region, the first impurity region being operably coupled to the reconfigurable logic component; and a resistive switching device coupled to the transistor device and to the reconfigurable logic component, the resistive switching device comprising a bottom electrode coupled to the first impurity region, a top electrode including at least a portion comprising an active metal material spatially extending in a first direction, and a resistive switching element in physical and electrical contact with the active metal material of the top electrode and to the bottom electrode at an intersecting region between the bottom electrode and the top electrode, wherein the resistive switching device stores a resistance state from a plurality of resistance states that indicates a configuration code for the reconfigurable logic component;

wherein the resistive switching element comprises an amorphous silicon material configured to allow formation of a filament structure therein, wherein the filament structure comprises a metal region comprising metal particles from the active metal material.

2. The device of claim 1 wherein the resistive switching device is embedded in the non-volatile field programmable gate array.

3. The device of claim 1 wherein the bottom electrode is coincident with the first impurity region.

4. The device of claim 1 wherein the reconfigurable logic component comprises reconfigurable logic blocks and reconfigurable interconnects between the logic blocks.

5. The device of claim 1 further comprising a word line electrically coupled to the gate structure, the word line being selectively applying a select voltage to the transistor device.

6. The device of claim 1 wherein the top electrode forms a bitline for the non-volatile field programmable gate array.

7. The device of claim 6 wherein the bitline is coupled to a bit terminal.

8. The device of claim 5 wherein the word line extends in a second direction that is orthogonal to the first direction.

9. The device of claim 1 further comprising
a voltage source configured to provide an operating voltage to the resistive switching device;
wherein the second impurity region is coupled to the voltage source.

10. The device of claim 9 wherein the operating voltage is selected from a group consisting of: a write voltage, a read voltage, or an erase voltage.

11. The device of claim 10
wherein the operating voltage is the write voltage; and
wherein the write voltage comprises a positive bias voltage applied between the top electrode and the second impurity region to cause the resistive switching device to be in a high bit.

12. The device of claim 1 wherein the configuration code comprises a bit output from the resistive switching device.

13. The device of claim 1 wherein the non-volatile field programmable gate array is disposed in an N by M array.

14. The device of claim 1 wherein the resistive switching device is vertically integrated with the transistor device.

15. The device of claim 1 wherein the resistive switching device is vertically connected to the transistor device by at least a via structure.

16. The device of claim 1 wherein the amorphous silicon materially is not intentionally doped during fabrication.

17. The device of claim 1 further comprising:
another reconfigurable logic component;
another transistor device coupled to the other reconfigurable logic component, comprising another gate structure, another first impurity region, and another second impurity region, the other first impurity region being operably coupled to the other reconfigurable logic component; and
another resistive switching device coupled to the other transistor device and to the other reconfigurable logic component, the other resistive switching device comprising another bottom electrode coupled to the other first impurity region, the top electrode including at least another portion comprising the active metal material, and another resistive switching element in physical and electrical contact with the active metal material of the top electrode and to the other bottom electrode at an intersecting region between the other bottom electrode and the top electrode, wherein the other resistive switching device stores a resistance state from the plurality of resistance states that indicates a configuration code for the other reconfigurable logic component;

wherein the other resistive switching element comprises an amorphous silicon material configured to allow formation of a filament structure therein, wherein the filament structure comprises a metal region comprising metal particles from the active metal material.

18. The device of claim 17 wherein the active metal material is selected from a group consisting of: gold, silver, platinum, palladium, nickel, and aluminum.

19. The device of claim 15 wherein the via structure is selected from a group consisting of: tungsten, copper, aluminum, and a semiconductor material.

20. A method of configuring a field programmable gate array, comprising:
providing a field programmable gate array, the field programmable gate array comprising a plurality of resistive switching devices, a plurality of transistor devices, and a plurality of reconfigurable logic components, a first impurity region of each of the plurality of transistor devices being respectively coupled to a resistive switching device by one or more via structures;
applying a first voltage to a gate of a transistor associated with a resistive switching device to be programmed to cause a channel region of the transistor to become conductive;
applying a second voltage between a top electrode of the resistive switching device comprising amorphous silicon-containing material and a second impurity region of the transistor to apply a first bias voltage to the resistive switching device, wherein a filament structure formed in the amorphous silicon-containing material is modified in response to the first bias voltage to cause the resistive switching device to be in a predetermined resistance state, wherein the predetermined resistance state is associated with a configuration code for a reconfigurable logic component;
removing the first voltage and the second voltage;
applying a third voltage to top electrodes of the plurality of resistive switching devices and measuring respective current flows in each of the plurality of resistive switching devices to determine a respective resistance state of each of the plurality of resistive switching devices;
outputting the respective resistance state of each of the plurality of resistive switching devices to a configuration data file, wherein the configuration data file comprises a plurality of configuration codes for reconfiguring each of the plurality of reconfigurable logic components.

21. The method of claim 20 wherein the first voltage is a select voltage.

22. The method of claim 20 wherein the second voltage is selected from a group consisting of: a write voltage, an erase voltage.

23. The method of claim 20 wherein the third voltage is a read voltage.

24. The method of claim 20 wherein the second voltage is characterized by a first amplitude.

25. The method of claim 20 wherein the third voltage is characterized by a second amplitude less than about half of the first amplitude.

26. The method of claim 20 wherein the configuration code is an instruction code for the plurality of reconfigurable logic components.

27. The method of claim 20 wherein the transistor device is a select transistor for the respective resistive switching device.

28. The method of claim 20 wherein
the top electrode comprises an active metal material selected from a group consisting of: gold, silver, platinum, palladium, nickel, and aluminum and
wherein the filament structure comprises active metal material from top electrode.

29. The method of claim 20 wherein the resistive switching device is configured in an N by M embedded array, where N and M are integers greater than one.

* * * * *